(12) United States Patent
Ko

(10) Patent No.: US 9,715,050 B2
(45) Date of Patent: Jul. 25, 2017

(54) OPTICAL WAVELENGTH DISPERSION DEVICE AND METHOD OF MANUFACTURING THE SAME

(75) Inventor: Cheng-Hao Ko, Hsinchu County (TW)

(73) Assignee: Cheng-Hao Ko, Hsinchu County (TW)

( * ) Notice: Subject to any disclaimer, the term of this patent is extended or adjusted under 35 U.S.C. 154(b) by 835 days.

(21) Appl. No.: 13/556,144

(22) Filed: Jul. 23, 2012

(65) Prior Publication Data

US 2013/0135740 A1    May 30, 2013

Related U.S. Application Data

(60) Provisional application No. 61/563,734, filed on Nov. 25, 2011.

(51) Int. Cl.
*G02B 5/18*       (2006.01)
*G03F 7/16*       (2006.01)
*B32B 38/00*      (2006.01)
*B32B 37/24*      (2006.01)
*G03F 7/00*       (2006.01)
*G02B 27/09*      (2006.01)

(52) U.S. Cl.
CPC ............ *G02B 5/1857* (2013.01); *B32B 37/24* (2013.01); *B32B 38/0008* (2013.01); *B32B 38/0036* (2013.01); *G02B 5/1861* (2013.01); *G02B 27/0944* (2013.01); *G03F 7/0005* (2013.01); *G03F 7/168* (2013.01); *B32B 2037/243* (2013.01); *B32B 2307/416* (2013.01); *B32B 2310/085* (2013.01); *B32B 2310/0831* (2013.01); *B32B 2311/04* (2013.01); *B32B 2311/18* (2013.01); *B32B 2551/00* (2013.01)

(58) Field of Classification Search
CPC ............ H04B 10/2519; H04B 10/2531; H04B 10/2537; H04B 10/2543; H04B 10/2572; G02B 6/29392; G02B 6/29394; G02B 27/0037; G02B 27/0944
USPC .................. 385/31, 37; 359/337.5, 577–590; 398/81–82, 84, 87, 136, 139, 141–142, 398/147–150, 192, 200–201, 212, 214
See application file for complete search history.

(56) References Cited

U.S. PATENT DOCUMENTS

| 2004/0196458 A1* | 10/2004 | Shimizu | G01J 3/02 356/328 |
| 2005/0051729 A1* | 3/2005 | Chrisp | 250/339.07 |
| 2006/0098929 A1* | 5/2006 | Steenblik et al. | 385/131 |
| 2007/0086703 A1* | 4/2007 | Kirk | G02B 6/12007 385/37 |
| 2009/0034080 A1* | 2/2009 | Ko | G02B 26/106 359/572 |

* cited by examiner

*Primary Examiner* — Kimberly N Kakalec
(74) *Attorney, Agent, or Firm* — Raymond Y. Chan; David and Raymond Patent Firm

(57) ABSTRACT

An optical wavelength dispersion device includes a first substrate, an input unit formed on the first substrate having a slit for receiving an optical signal, a grating formed on the first substrate for producing a diffracted light beams from the optical signal, a first optical reflector formed on the first substrate for reflecting the diffracted light beams from the grating for outputting, and a second substrate covered on the top of the input unit and the grating, wherein the input unit, the grating and the first optical reflector are formed from a photo-resist layer by high energy light source exposure.

8 Claims, 10 Drawing Sheets

OPTICAL WAVELENGTH DISPERSION DEVICE AND METHOD OF MANUFACTURING THE SAME

CROSS REFERENCE OF RELATED APPLICATION

This is a non-provisional application that claims the benefit of priority under 35U.S.C. §119 to a provisional application, application No. 61/563,734, filed Nov. 25, 2011.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention generally relates to a wavelength dispersion device, more particularly to an optical wavelength dispersion device in a SoC (system on chip) for reducing the size and cost of the device.

Description of Related Arts

Optical communication is any form of telecommunication that uses light as the transmission medium. An optical communication system consists of a transmitter, which encodes a message into an optical signal, a channel, which carries the signal to its destination, and a receiver, which reproduces the message from the received optical signal. The receiver comprises an input slit for receiving the optical signal, and a grating for splitting and diffracting the optical signal in different directions for outputting. In other optical applications, such as spectrometers or optical analyzers, the grating plays an important role in the applications. Nowadays, although the grating can be made from silicon wafer, however, the receiver cannot. Therefore, the size and cost of the receiver is not effective.

By far, the leading technology for manufacturing MEMS devices is Si-micromachining and its various derivatives. However, many applications of microsystems have requirements on materials basis, geometry, aspect ratio, dimensions, shape, accuracy of microstructures, and number of parts that cannot be fulfilled easily by mainstream silicon-based micromachining technologies. LIGA, an alternative microfabrication process combining lithography, electroplating and molding, enables the high precision manufacture of microstructures with large structural height ranging from hundreds to thousands of micrometers thick. The yield of de-molding process in LIGA is not high enough for fabricating vertical grating due to the small pitches of grating structure.

U.S. Pat. No. 7,034,935 discloses a high performance miniature spectrometer with a detector array optically coupled to a slab waveguide structure, and a focal plane provided outside of the output face of the slab waveguide structure. The detector array is mounted onto the slab waveguide structure at a fixed distance from the output face on the output focal plane. Obviously, the size of the spectrometer in the U.S. Pat. No. 7,034,935 is not effective because the structure of the spectrometer is assembled by a plurality of elements.

U.S. Pat. No. 7,485,869 discloses an optical spectroscopy tool performed in the vacuum ultraviolet (VUV). However, the size of the spectroscopy in U.S. Pat. No. 7,485,869 is not effective because the structure of the spectroscopy is assembled by a plurality of elements.

U.S. Patent Application, publication no. 2010053611, discloses a diffraction grating structure having ultra-high density of grooves, which comprises an echellette substrate having periodically repeating recessed features, and a multilayer stack of materials disposed on the echellette substrate. The diffraction grating is formed by semiconductor processes. However, it is not a SoC structure.

According to the drawbacks aforementioned, the present invention provides an optical wavelength dispersion device and method of manufacturing the same for reducing the size and cost of the device.

SUMMARY OF THE PRESENT INVENTION

An objective of the present invention is to provide an optical wavelength dispersion device with small size and lower cost.

Another objective of the present invention is to provide an optical wavelength dispersion device in a SoC (system on chip) by high energy light source exposure.

For achieving the above objectives, the present invention provides an optical wavelength dispersion device, comprising:

a first substrate;

an input unit formed on the first substrate having a slit for receiving an optical signal;

a grating formed on the first substrate for producing diffracted light beams from the optical signal;

a first optical reflector formed on the first substrate for reflecting the diffracted light beams from the grating for outputting; and a second substrate covered on the first substrate, wherein the input unit, the first optical reflector and the grating are formed from a photo-resist layer by high energy light source exposure, and the wavelength of the high energy light source is from 0.01 to 100 nm.

According to the optical wavelength dispersion device aforementioned, the high energy light source is selected from X-ray, soft X-ray or EUV.

According to the optical wavelength dispersion device aforementioned, the width of the slit is from 5 to 500 µm.

According to the optical wavelength dispersion device aforementioned, the grating has a concave, convex or planar profile with pitches of laminar type, saw-tooth type, blaze type, sinusoidal type or a combination of those types.

According to the optical wavelength dispersion device aforementioned, the first substrate and the second substrate are semiconductor substrates, glass substrates, metal substrates or plastic substrates.

According to the optical wavelength dispersion device aforementioned, it further comprises a second optical reflector formed on the first substrate for reflecting the diffracted light beams from the first optical reflector.

According to the optical wavelength dispersion device aforementioned, the first optical reflector and the second optical reflector are formed from the photo-resist layer by the high energy light source exposure.

Another embodiment of the present invention provides an optical wavelength dispersion device, comprising:

a first substrate;

an input unit formed on the first substrate having a slit for receiving an optical signal;

a first optical reflector formed on the first substrate for reflecting the optical signal;

a grating formed on the first substrate for producing diffracted light beams from the optical signal reflected by the first optical reflector for outputting; and a second substrate covered on the first substrate, wherein the input unit, the first optical reflector and the grating are formed from a photo-resist layer by high energy light source exposure.

According to the optical wavelength dispersion device aforementioned, it further comprises a second optical reflector formed on the first substrate for reflecting the diffracted light beams from the grating.

Another yet embodiment of the present invention provides a method of manufacturing an optical wavelength dispersion device, comprising the following steps:

(a) providing a first substrate;

(b) forming a photo-resist layer on the first substrate;

(c) exposing the photo-resist layer by high energy light source through a high-energy-light-source mask, wherein the wavelength of the high energy light source is from 0.01 to 100 nm;

(d) developing the photo-resist layer for forming an input unit with a slit, a grating and a first optical reflector;

(e) coating a reflective layer on the surface of the first substrate, the input unit, the first optical reflector and the grating; and (f) covering a second substrate on the first substrate.

According to the method of manufacturing an optical wavelength dispersion device aforementioned, the high energy light source is selected from X-ray, soft X-ray or EUV.

According to the method of manufacturing an optical wavelength dispersion device aforementioned, the width of the slit is from 5 to 500 μm.

According to the method of manufacturing an optical wavelength dispersion device aforementioned, the grating has a concave, convex or planar profile with pitches of laminar type, saw-tooth type, blaze type, sinusoidal type or a combination of those types.

According to the method of manufacturing an optical wavelength dispersion device aforementioned, the first substrate and the second substrate are semiconductor substrates, glass substrates, metal substrates or plastic substrates.

According to the method of manufacturing an optical wavelength dispersion device aforementioned, the thickness of the photo-resist layer is from 10 to 1000 μm.

According to the method of manufacturing an optical wavelength dispersion device aforementioned, the high energy light source mask comprises a third substrate, a metal layer formed on the third substrate, metal patterns formed on the top of the metal layer and a silicon layer formed on the bottom of the third substrate.

According to the method of manufacturing an optical wavelength dispersion device aforementioned, the material of the third substrate is $Si_3N_4$ or SiC and the thickness of the third substrate is from 1 to 5 μm.

According to the method of manufacturing an optical wavelength dispersion device aforementioned, the metal layer is a Ti layer with thickness from 10 to 200 nm and the metal patterns are Au patterns with a thickness from 1 to 10 μm.

According to the method of manufacturing an optical wavelength dispersion device aforementioned, after the step (c), the method further comprises the step of rotating the high energy light source mask together with the first substrate by a specified angle with respect to the beam direction of the high energy light source to form a second optical reflector by a second time high energy light source exposure.

According to the method of manufacturing an optical wavelength dispersion device aforementioned, after the step (c), the method further comprises the step of providing a second optical reflector formed by a second time high energy light source exposure through a photo-mask with a specified angle rotation opposite to the first substrate.

According to the method of manufacturing an optical wavelength dispersion device aforementioned, the method further comprises the step of hard baking the input unit, the grating and the optical reflector with temperature from 100 to 200° C.

According to the method of manufacturing an optical wavelength dispersion device aforementioned, the method further comprises the step of coating a high reflectivity coating layer on the surface of the first substrate, the input unit, the grating, the first optical reflector and the second optical reflector.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

For optical communication devices, basic elements, such as gratings, can be made from silicon wafer but some cannot. Therefore, it is desirable to provide a method for fabricating the all elements of optical communication devices by lithographic manufacturing processes.

Figure 1A:
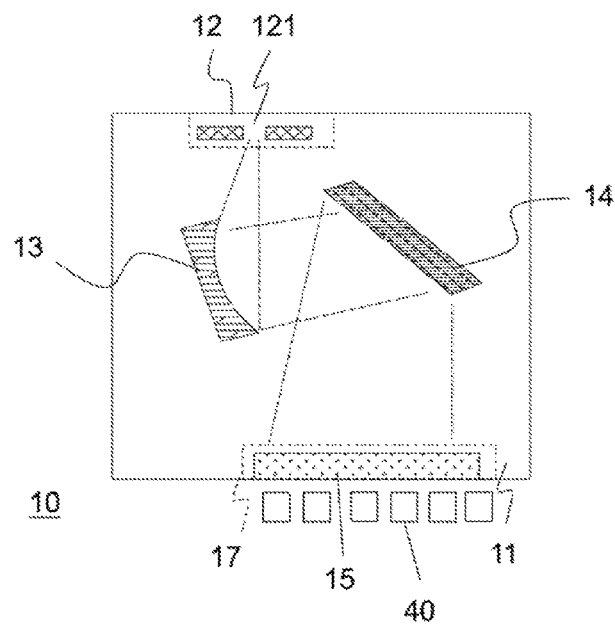
FIG. 1(a) to FIG. 1(d) illustrate hint diagrams of the optical wavelength dispersion device of the present invention.
Figure 1B:
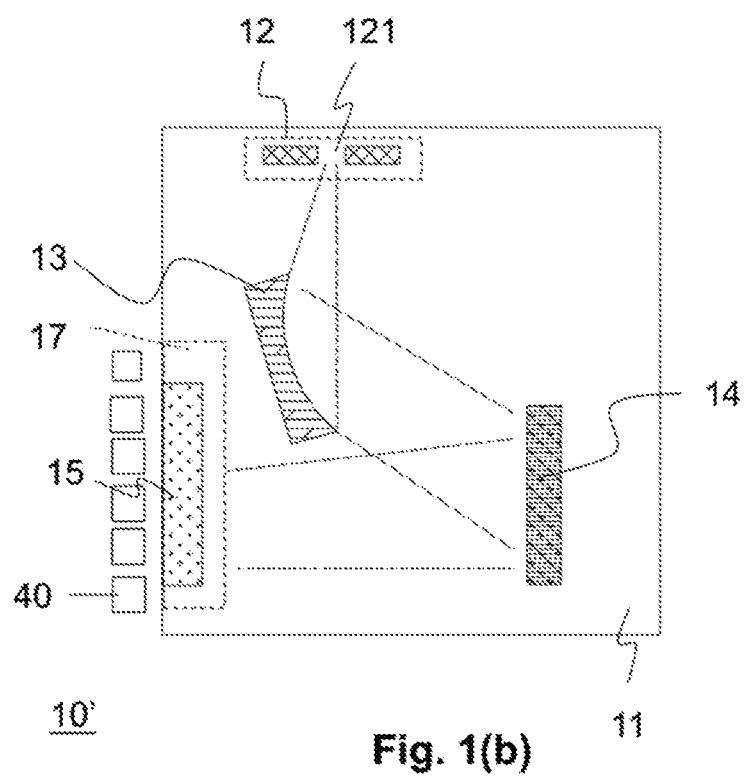
Figure 1C:
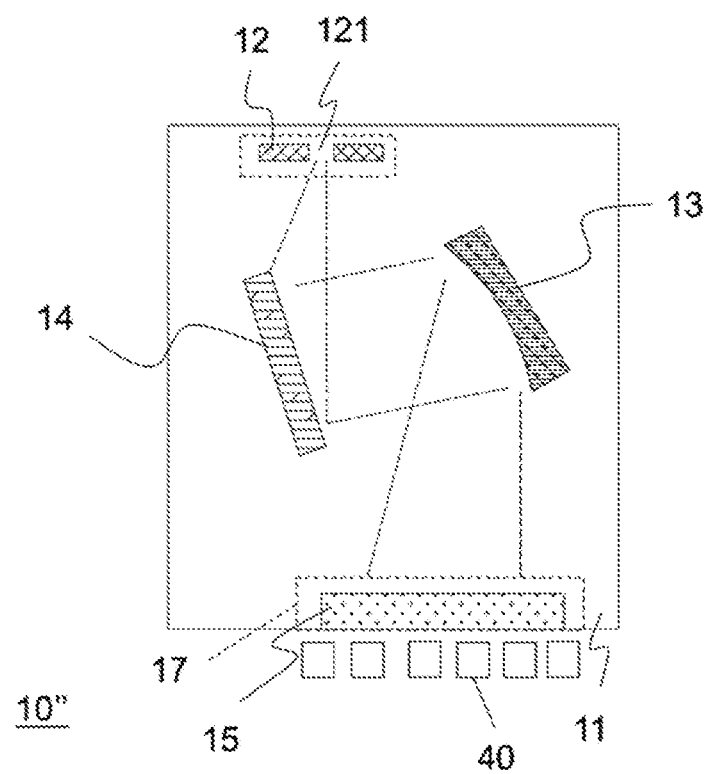
Figure 1D:
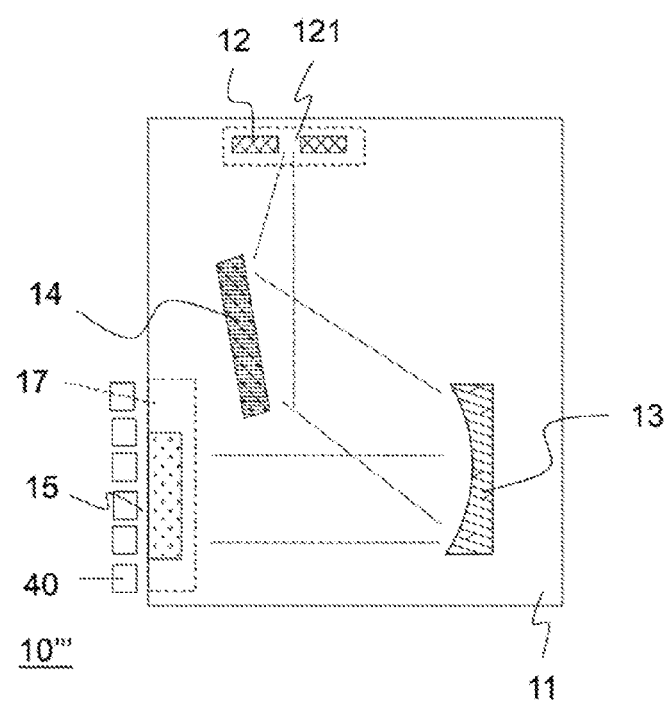

Referring to FIG. 1(a), FIG. 1(a) illustrates a hint diagram of the optical wavelength dispersion device of the present invention. The optical wavelength dispersion device 10 comprises a first substrate 11, an input unit 12 having a slit 121, a grating 13, a first optical reflector 14, an output unit 17, and a second substrate (not shown). The input unit 12 is formed on the first substrate 11 for receiving an optical signal through the slit 121. The width of the slit is about 5500 μm. The grating 13 is formed on the first substrate 11 for producing diffracted light beams from the optical signal. The grating 13 has a concave, convex or planar profile with pitches of laminar type or saw-tooth type or blaze type or sinusoidal type or a combination of those types. Generally speaking, the optical signals of different wavelengths are focused at different locations on the output unit. The grating 13 is blazed to increase the diffraction efficiency of the specified diffraction order. The wavelength of the optical signals is adaptable from 200 to 2000 nm. The first optical reflector 14 reflects the diffracted light beams from the grating 13 to the output unit 17. The output unit is used for outputting the diffracted light beams from the first optical reflector 14. The external sensor 40 receives the diffracted light beams from the first optical reflector 14 for afterward processing. The second substrate (not shown) is covered on the first substrate 11 and contacts the tops of the input unit 12, the grating 13 and the first optical reflector 14. Therefore, the space between the first substrate 11 and the second substrate (not shown) works as an optical waveguide for receiving and transmitting optical signals.

Moreover, the input unit 12, the grating 13 and the first optical reflector 14 are formed from a photo-resist layer by a high energy light source exposure. The high energy light source can be X-ray, soft X-ray or EUV (extreme UV). The wavelength of X-ray is from 0.01 to 1 nm, the wavelength of soft X-ray is from 0.1 to 10 nm, and the wavelength of EUV is from 10 to 120 nm. Due to the surface roughness limitation in optical telecommunications and local optical communications, the wavelength with 0.1 to 1 nm of the high energy light source is better than that with 1 to 100 nm. The first substrate 11 and the second substrate are semiconductor substrates, glass substrates, metal substrates or plastic substrates. Therefore, the shape of the optical wavelength dispersion device 10 of the present invention can be rectangular or square.

In FIG. 1(*a*), due to the reflecting angle of the first optical reflector 14, the output direction of the diffracted light beams from the first optical reflector 14 to the output unit 17 is the same as the input direction of the optical signal. Therefore, the shape of the optical wavelength dispersion device 10 of the present invention can be rectangular or square.

Referring to FIG. 1(*b*), FIG. 1(*b*) illustrates another hint diagram of the optical wavelength dispersion device of the present invention. The optical wavelength dispersion device 10' comprises a first substrate 11, an input unit 12 having a slit 121, a grating 13, a first optical reflector 14, an output unit 17, and a second substrate (not shown) similar to the optical wavelength dispersion device 10 shown in FIG. 2(*a*). Due to the reflecting angle of the first optical reflector 14, the included angle between the output direction of the diffracted light beams from the first optical reflector 14 and the input direction of the optical signal is about 45 to 135 degree, wherein 90 degree is preferred. Therefore, the shape of the optical wavelength dispersion device 10' of the present invention can be rectangular or square.

In FIG. 1(*a*) and FIG. 1(*b*), the optical wavelength dispersion device 10 and 10' further comprise a second optical reflector 15 formed on the first substrate 11 for reflecting the diffracted light beams from the first optical reflector 14. Thus, the external sensor 40 can be positioned in any direction (especially in upper or lower side) near the optical wavelength dispersion device 10, 10' according to the user designation. Also, the second optical reflector 15 is formed from the photo-resist layer by high energy photon exposure.

Referring to FIG. 1(*c*), FIG. 1(*c*) illustrates another hint diagram of the optical wavelength dispersion device of the present invention. The optical wavelength dispersion device 10" comprises a first substrate 11, an input unit 12 having a slit 121, a first optical reflector 14, a grating 13, an output unit 17, and a second substrate (not shown). The input unit 12 is formed on the first substrate 11 for receiving an optical signal through the slit 121. The first optical reflector 14 is formed on the first substrate 11 for reflecting the optical signal from the input unit. The grating 13 is formed on the first substrate 11 for producing diffracted light beams from the optical signal reflected by the first optical reflector 14. The output unit is used for outputting the diffracted light beams from the grating. The external sensor 40 receives the diffracted light beams from the grating 13 for afterward processing. The second substrate (not shown) is covered on the first substrate 11 and contacts the tops of the input unit 12, the grating 13 and the first optical reflector 14. The external sensor 40 receives the diffracted light beams from the grating 13 for afterward processing.

In FIG. 1(*c*), due to the reflecting angle of the first optical reflector 14, the output direction of the diffracted light beams from the grating 13 and the output unit 17 is the same as the input direction of the optical signal. Therefore, the shape of the optical wavelength dispersion device 10" of the present invention can be rectangular or square.

Referring to FIG. 1(*d*), FIG. 1(*d*) illustrates another hint diagram of the optical wavelength dispersion device of the present invention. The optical wavelength dispersion device 10''' comprises a first substrate 11, an input unit 12 having a slit 121, a first optical reflector 14, a grating 13, an output unit 17 and a second substrate (not shown) similar to the optical wavelength dispersion device 10" shown in FIG. 1(*c*). Due to the reflecting angle of the first optical reflector 14, the included angle between the output direction of the diffracted light beams from the grating 13 and the input direction of the optical signal is about 45 to 135 degree, wherein 90 degree is preferred. Therefore, the shape of the optical wavelength dispersion device 10''' of the present invention can be rectangular or square.

Figure 2A:
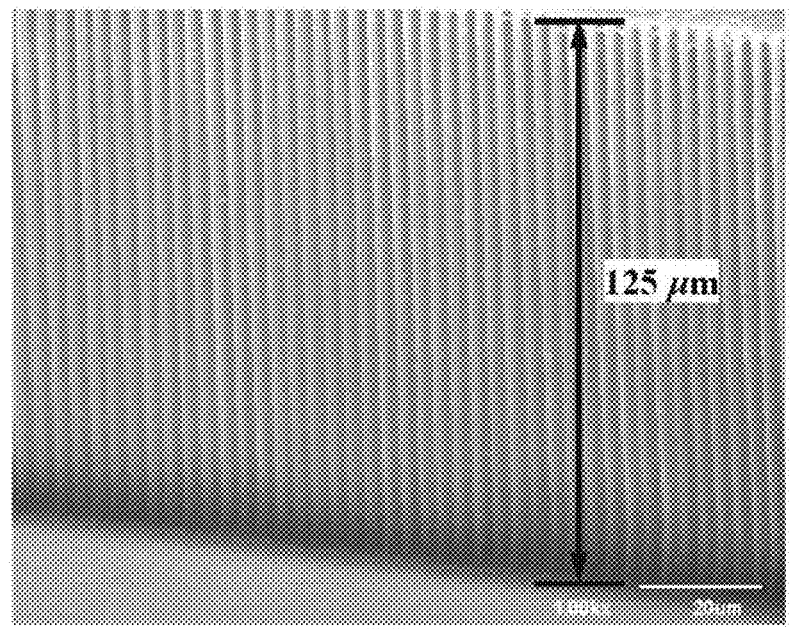
FIG. 2(a) and FIG. 2(b) illustrate the top view and lateral view of the grating in FIG. 1(a) to FIG. 1(d) respectively.
Figure 2B:
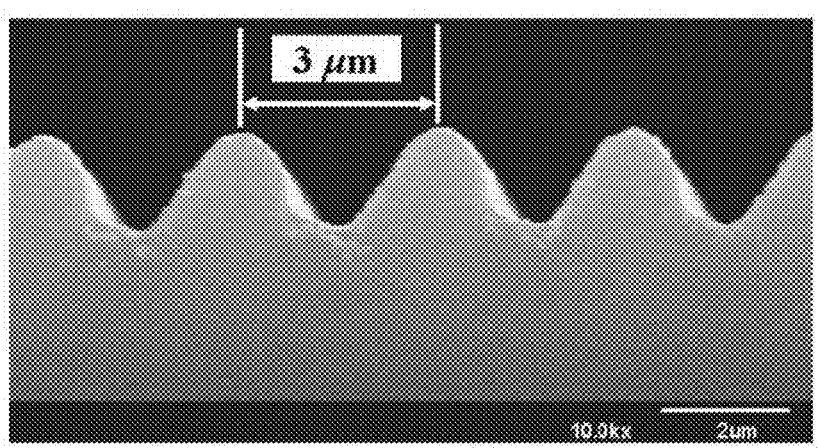
Figure 3:
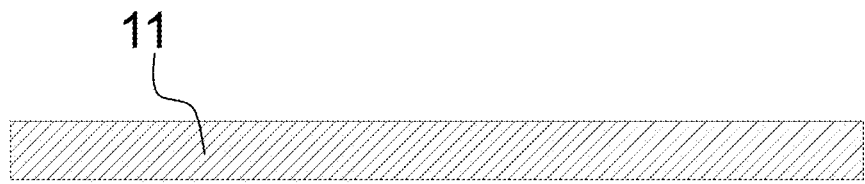
FIG. 3 to FIG. 9 illustrate processes for manufacturing the optical wavelength dispersion device of the present invention.

FIG. 2(*a*) and FIG. 2(*b*) illustrate the top view and lateral view of the grating 13 in FIGS. 1(*a*) to 1(*d*) respectively. After the high energy light source exposure, the pitch between adjacent peaks of the grating is about 3 μm and the surface roughness of the grating is about 5~10 nm. Thus, the grating is suitable for using in both optical telecommunications and local optical communications.

Figure 4:
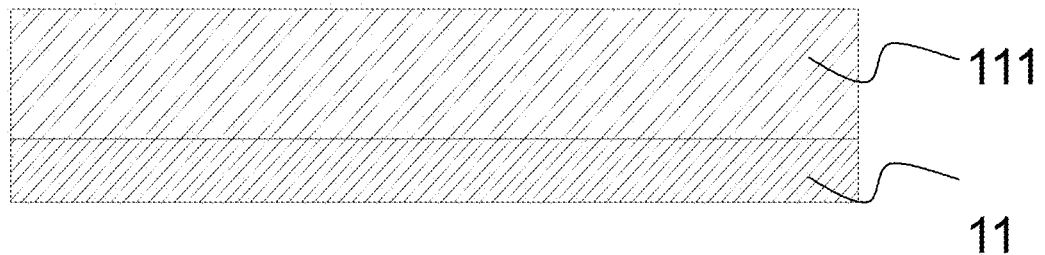
Figure 5:
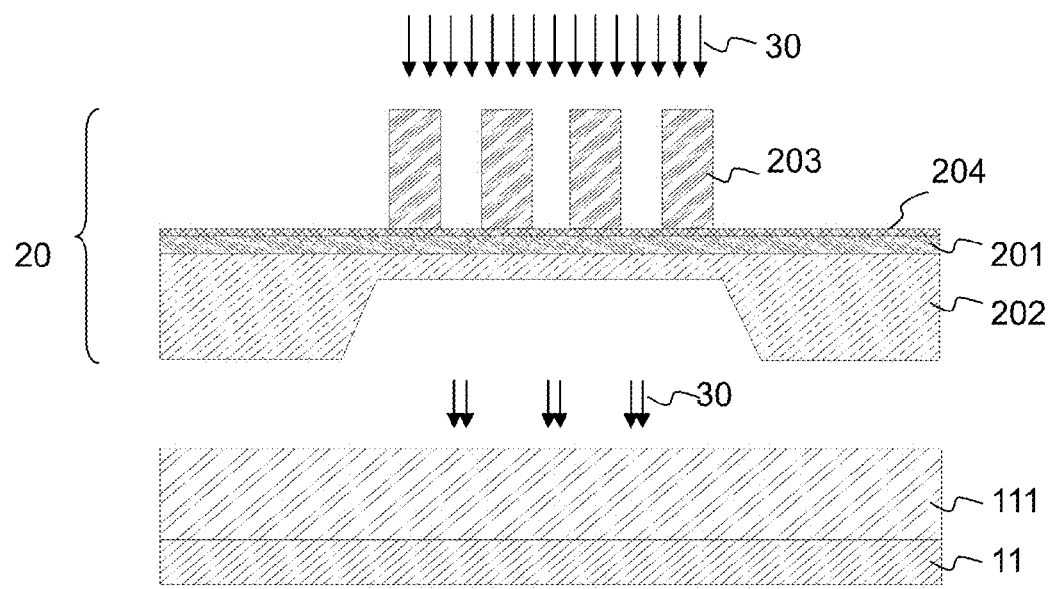

FIG. 3 to FIG. 9 illustrate the processes for manufacturing the optical wavelength dispersion device of the present invention. As shown, for manufacturing the optical dispersion device, first, a first substrate 11 is provided and a photo-resist layer 111 with thickness about 10~1000 μm is formed on the first substrate 11 (FIG. 4). All components of the optical wavelength dispersion device 10 of the present invention will be formed from the photo-resist layer 111, and the material of the photo-resist layer 111 is, for example, SU-8 or PMMA. Then, the photo-resist layer 111 is exposed by high energy light source (for example, X-ray) 30 through a high energy light source (X-ray) mask 20 (FIG. 5). As shown in FIG. 5, the high energy light source (X-ray) mask 20 comprises a substrate 201 ($Si_3N_4$ or SiC) with thickness about 1~5 μm, a Ti layer 204 with thickness about 10~200 nm formed on the substrate 201, Au patterns 203 disposed on the top of the Ti layer 204, and a silicon layers 202 disposed on the bottom of the substrate 201. A part of high energy light source (X-ray) 30 is blocked by the Au patterns 203 with a thickness of 1 to 10 μm and the Au patterns 203 of the high energy light source (X-ray) mask 20 are transferred to the photo-resist layer 111 through a high energy light source (X-ray) exposure.

Figure 6:
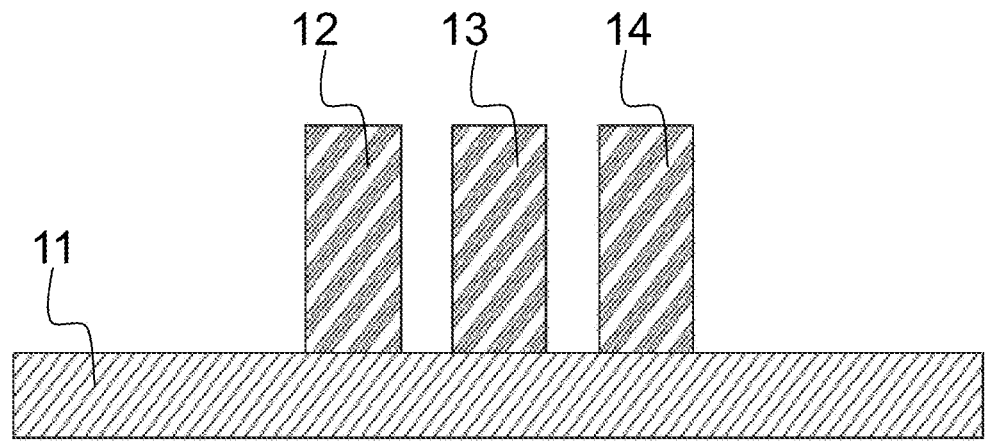
Figure 7A:
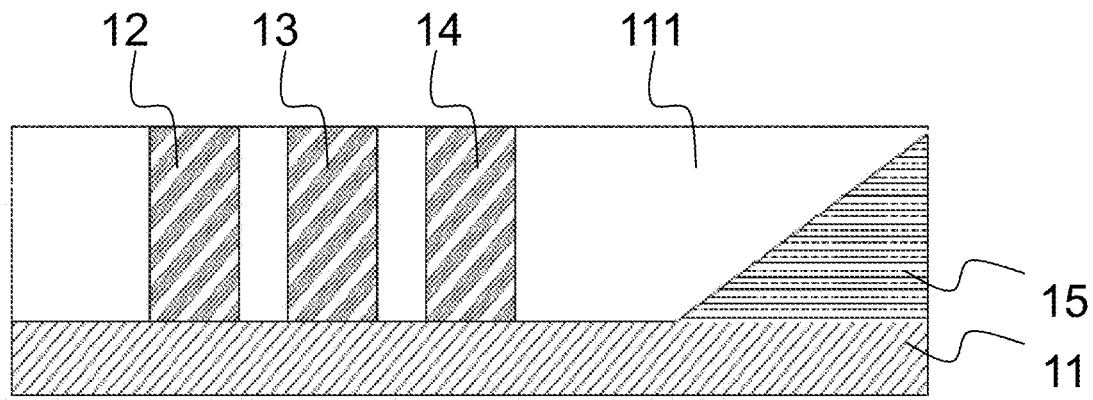
Figure 7B:
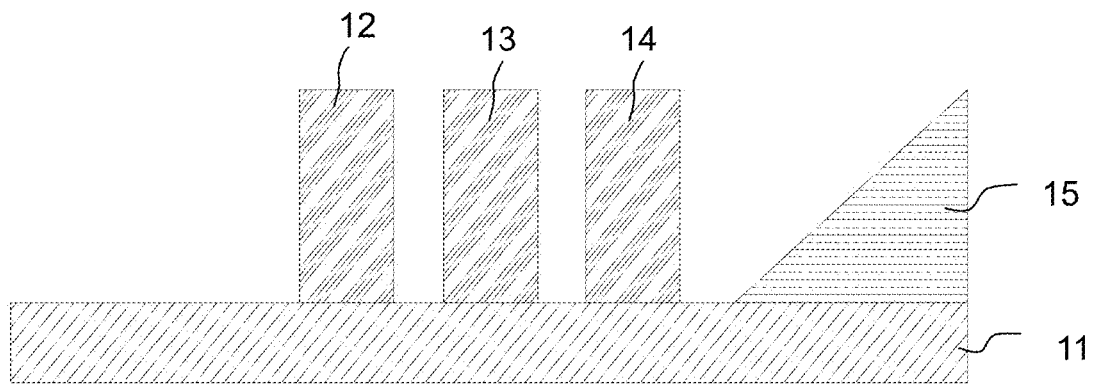

After the X-ray exposure (for example), the photo-resist layer 111 with the X-ray exposed area is developed. As shown in FIG. 6, after the development of the photo-resist, the exposed area of the photo-resist layer 111 forms an input unit 12 with a slit 121, a grating 13 and a first optical reflector 14 (shown in FIG. 1). Furthermore, a second optical reflector 15 is formed by a second X-ray exposure through the X-ray mask 20 with a specified angle (for example, 45 degrees) with respect to the incoming direction of the high energy photon (for example, X-ray) before the development of the photo-resist. Or, the second optical reflector 15 is formed by a second exposure with another high-energy-light mask (photo mask). Also, the high-energy-light mask 20 together with the first substrate 11 (shown in FIG. 5) should be rotated at a particular angle (for example, 45 degree), with respect to the incoming direction of the high energy photon (for example, X-ray), during the exposure as shown in FIG. 7(a) and FIG. 7(b). Or, the photo-mask is rotated with a specified angle opposite to the first substrate during the second exposure for forming the second optical reflector. For increasing the strength of the input unit 12, the grating 13, the first optical reflector 14 and the second optical reflector 15 are hard baked with temperature from 100 to 200° C.

Figure 8:
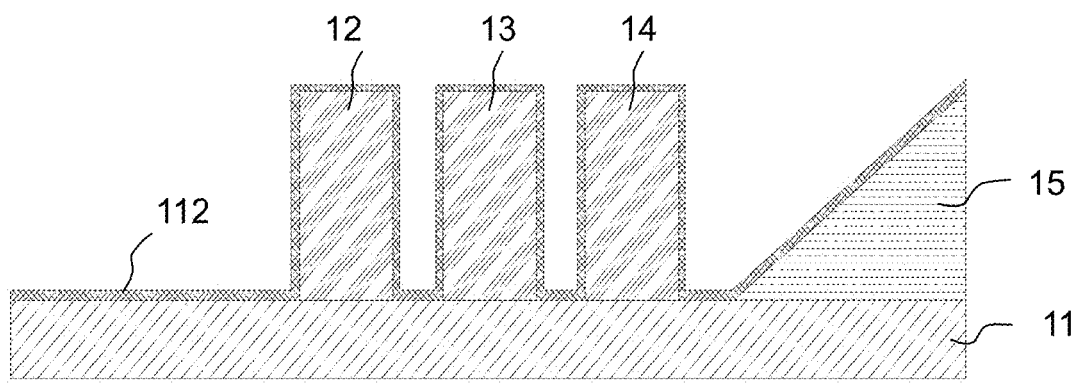

For increasing the reflectivity of the first substrate 11, the input unit 12, the grating 13, the first optical reflector 14 and the second optical reflector 15, a high reflectivity coating layer (Au layer or Al layer) 112 is then coated on the surface of the first substrate 11, the input unit 12, the grating 13, the first optical reflector 14 and the second optical reflector 15 (shown in FIG. 8). Finally, a second substrate 16 with high reflectivity coating layer (Au layer or Al layer) 112 is covered on the first substrate 11 and contacts the tops of the input unit 12, the grating 13 and the first optical reflector 14. Therefore, referring to FIG. 9, the space between the first substrate 11 and the second substrate 15 works as an optical waveguide for the propagation of the optical signals from the input unit 12 to the detector (not shown).

Figure 9:
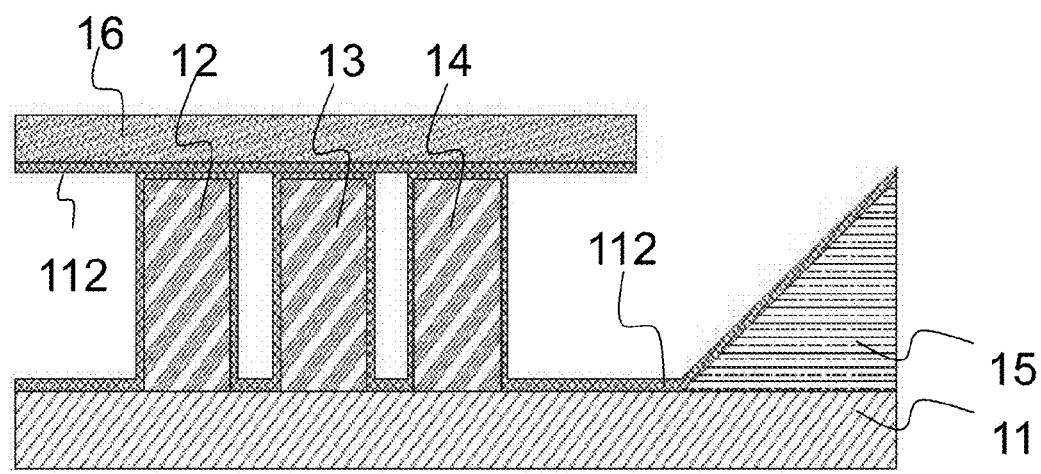

Moreover, not shown in FIG. 9, there are pluralities of first connecting units formed on the first substrate 11 for combining with second connecting units formed on the second substrate 16. By the combination of the first connecting units and the second connecting units, the structure steadiness of the optical wavelength dispersion device 10 is, therefore, improved.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An optical wavelength dispersion device, comprising:
   a first substrate;
   an input unit, which is formed on the first substrate, having a slit for receiving an optical signal;
   a grating formed on the first substrate for producing a diffracted light beams from the optical signal;
   a first optical reflector formed on the first substrate for reflecting the diffracted light beams from the grating for outputting;
   a second optical reflector formed on the first substrate for reflecting the diffracted light beams from the first optical reflector in such a manner that an external sensor is capable of being positioned in any direction near the optical wavelength dispersion device;
   an output unit for outputting the diffracted light beams; and
   a second substrate covered on the top of the input unit and the grating;
   wherein the input unit, the first optical reflector, the second optical reflector and the grating are formed from a photo-resist layer being exposed under high energy light source exposure through a high energy light source mask, wherein the wavelength of the high energy light source is from 0.01 to 100 nm, wherein the first substrate and the second substrate define an optical waveguide space therebetween, wherein the input unit, the grating, the first optical reflector and the second optical reflector are respectively provided in the optical waveguide space.

2. The optical wavelength dispersion device according to claim 1, wherein the high energy light source is selected from a group consisting of X-ray, soft X-ray and EUV, wherein the first optical reflector has a reflecting angle to enable the first optical reflector to reflect the diffracted light beam to the output unit, wherein after the diffracted light beam is reflected by the first optical reflector, the output direction of the diffracted light beam is the same as the input direction of the optical signal.

3. The optical wavelength dispersion device according to claim 2, further comprising a high reflectivity coating layer coated on the first substrate, the first input unit, the grating and the first and second optical reflectors, wherein the high reflectivity coating layer is made of Au or Al material, wherein the width of the slit is from 5 to 500 μm.

4. The optical wavelength dispersion device according to claim 1, wherein the grating has a concave, convex or planar profile with pitches selected from a group consisting of laminar type, saw-tooth type, blaze type, sinusoidal type, and a combination of said laminar, saw-tooth, blaze, and sinusoidal types, wherein each of the pitches is defined between two adjacent peaks of the grating, wherein the width of each of said pitches is 3 μm.

5. The optical wavelength dispersion device according to claim 1, wherein the first substrate and the second substrate are selected from a group consisting of semiconductor substrates, glass substrates, metal substrates, and plastic substrates, wherein the first optical reflector has a reflecting angle to enable the first optical reflector to reflect the diffracted light beam to the output unit, wherein after the diffracted light beam is reflected by the first optical reflector, the included angle between the diffracted light beam and the optical signal is 45°-135°.

6. The optical wavelength dispersion device according to claim 1, wherein the first optical reflector and the second optical reflector are formed from the photo-resist layer by the high energy light source exposure.

7. An optical wavelength dispersion device, comprising:
   a first substrate;
   an input unit, which is formed on the first substrate, having a slit for receiving an optical signal;
   a first optical reflector formed on the first substrate for reflecting the optical signal;

a grating formed on the first substrate for producing diffracted light beams from the optical signal reflected by the first optical reflector for outputting;

a second optical reflector formed on the first substrate for reflecting the diffracted light beams from the grating in such a manner that an external sensor is capable of being positioned in any direction near the optical wavelength dispersion device;

an output unit for outputting the diffracted light beams; and a second substrate covered on the top of the input unit and the grating; wherein the input unit, the first optical reflector and the grating are formed from a photo-resist layer being exposed under high energy light source exposure through a high energy light source mask, wherein the first substrate and the second substrate define an optical waveguide space therebetween, wherein the input unit, the grating, the first optical reflector and the second optical reflector are respectively provided in the optical waveguide space.

8. The optical wavelength dispersion device according to claim 7, further comprising a high reflectivity coating layer coated on the first substrate, the first input unit, the grating and the first and second optical reflectors, wherein the high reflectivity coating layer is made of Au or Al material, wherein the first optical reflector and the second optical reflector are formed from the photo-resist layer by the high energy light source exposure.

* * * * *